(12) United States Patent
Lai et al.

(10) Patent No.: US 6,410,963 B1
(45) Date of Patent: Jun. 25, 2002

(54) ELECTROSTATIC DISCHARGE PROTECTION CIRCUITS WITH LATCH-UP PREVENTION FUNCTION

(75) Inventors: Chen-Shang Lai, Taichung; Meng-Huang Liu, Hsin-Chu; Shin Su, Taipei; Tao-Cheng Lu, Kaohsiung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/977,707

(22) Filed: Oct. 16, 2001

(51) Int. Cl.$^7$ ............................................... H01L 23/42
(52) U.S. Cl. ...................................... 257/355; 257/357
(58) Field of Search .................................. 257/355, 357

(56) References Cited

U.S. PATENT DOCUMENTS

| | | | |
|---|---|---|---|
| 5,550,701 A | * | 8/1996 | Nadd et al. |
| 5,684,322 A | * | 11/1997 | Bernier |
| 5,869,873 A | * | 2/1999 | Yu |
| 6,147,369 A | * | 11/2000 | Chen et al. |

FOREIGN PATENT DOCUMENTS

EP         439899-a2    *    8/1991

* cited by examiner

*Primary Examiner*—Stephen D. Meier (57) ABSTRACT

An electrostatic discharge protection which is electrically coupled with an interface terminal and a devices area, at least include a first bipolar junction transistor, a second bipolar junction transistor, a first MOS transistor, and a second MOS transistor. Both bipolar junction transistors forms the well-known silicon controlled rectifier, first MOS transistor locates between interface terminal and second bipolar junction transistor and second MOS transistor locates between emitter of second bipolar junction transistor and ground point, and gates of both MOS transistor electrically coupled with voltage base point whose voltage is equal to work voltage of devices area. While devices area is turned off, silicon controlled rectifier would be latch-up and provides function of electrostatic discharge protection. While devices area is turned on, second MOS transistor also is turned on so that part of current flows into ground point but not flows into second bipolar junction transistor. Thus, positive feedback between two bipolar junction transistors is reduced and then latch-up is eliminated.

19 Claims, 7 Drawing Sheets

ELECTROSTATIC DISCHARGE PROTECTION CIRCUITS WITH LATCH-UP PREVENTION FUNCTION

BACKGROUND OF THE INVENTION

1. Field of the Invention

This invention relates generally to electrostatic discharge protection circuit, and particularly relates to electrostatic discharge protection circuit with latch-up prevention function.

2. Description of the Prior Art

Figure 1A:
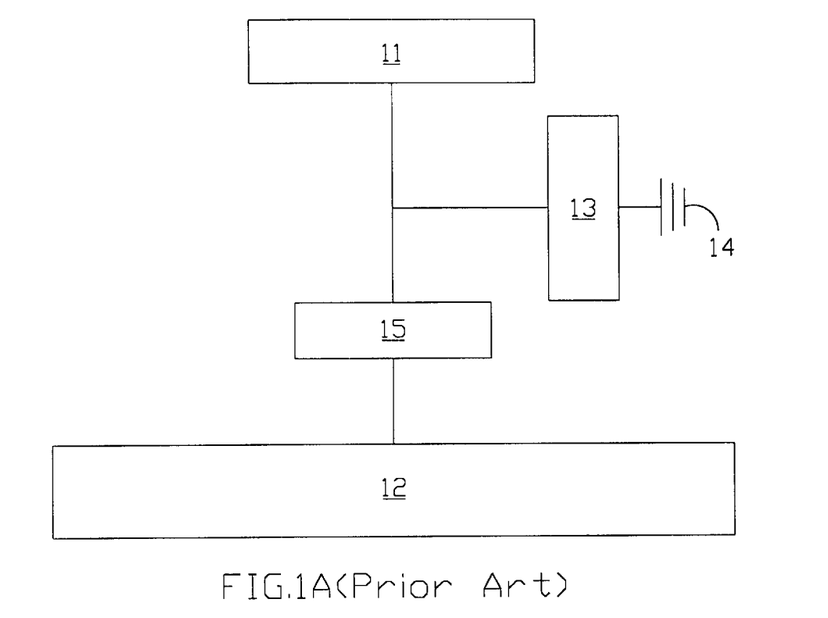
FIG. 1A through FIG. 1C shows location of ESD protection circuit, basic structure of ESD protection circuits with SCR, and equivalent circuits separately.

To prevent integrated circuits is damaged by large current or larger voltage, such as to prevent integrated circuits is damaged by large current induced by noise or insulation failure. As FIG. 1A shows, most of current integrated circuits not only have interface terminal 11, such as pad, for inputting and/or outputting and devices area 12, where numerous electronic devices locate, but also electrically couple electrostatic discharge protection circuit 13 with both interface terminal 11 and devices area 12. On normal times, electrostatic discharge protection (ESD) circuit 13 is off. In contrast, whenever voltage of external signal, which appears in interface terminal 11, is larger than the triggering voltage of electrostatic discharge protection circuit 13, electrostatic discharge protection circuit 13 is turned-on to conduct this external signal to ground point 13, such that devices area 12 is not affected by this external signal. Of course, to avoid devices area 12 is affected by this external signal before electrostatic discharge protection circuit 13 is turned-on, buffer area 15, which is turned-on slowly than electrostatic discharge protection circuit 13, is broadly located between interface terminal 11 and devices area 12.

Figure 1B:
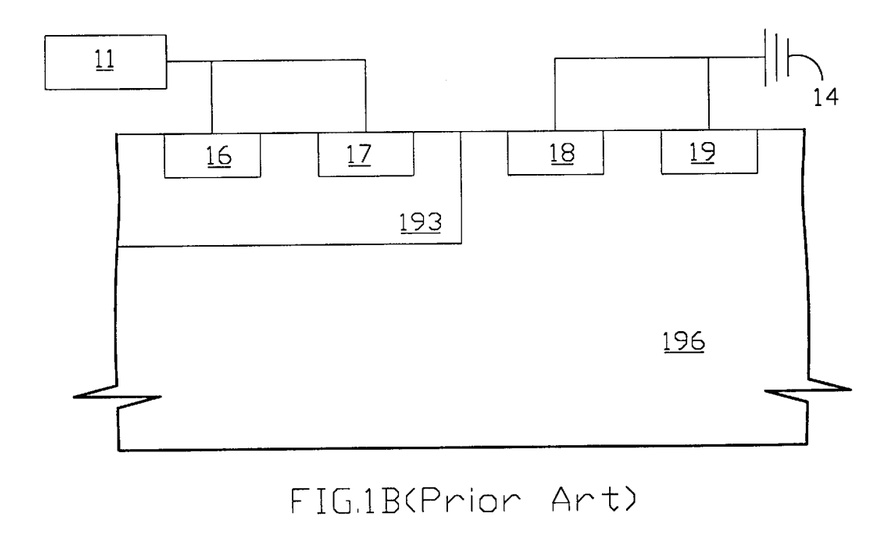
Figure 1C:
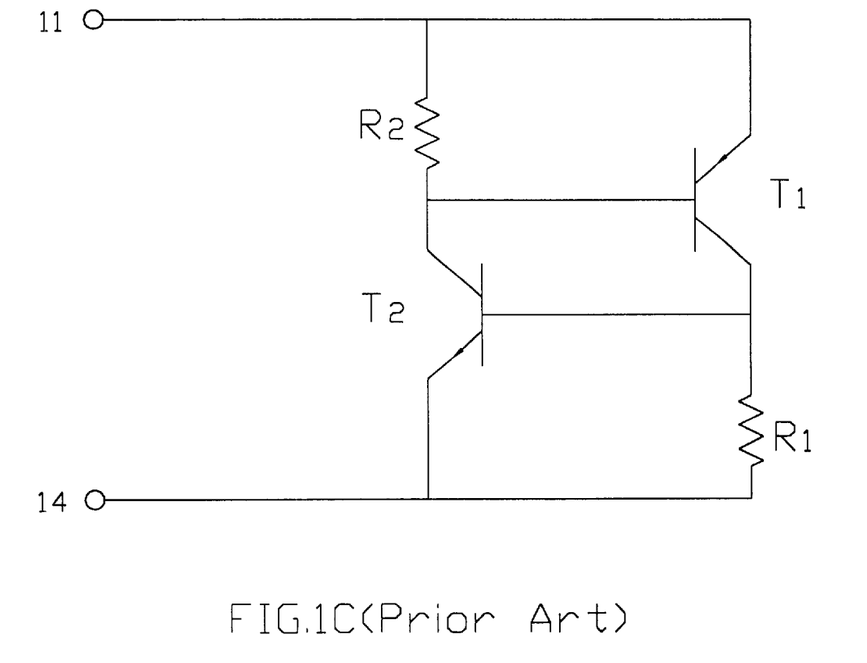

Although numerous electrostatic discharge protection circuits are available, silicon controlled rectifier (SCR) is the most efficient of all available ESD circuits in terms of ESD performance per unit. SCR essentially consists of a PNPN structure, as shown in FIG. 1B, both first N-type doped region 16, which locates in N-type well 193, and first P-type doped region 17 are electrically coupled with interface terminal 11, second N-type doped region 18 and second P-type doped region 19, both directly locate in P-type substrate 196, are electrically coupled with ground point 14. Equivalent circuit of SCR consists of two reciprocally electrically coupled bipolar junction transistors, as FIG. 1C shows. Where first bipolar junction transistor T1 is made from first P-type doped region 17, N-type well 193, and P-type substrate 196, second bipolar junction transistor T2 is made from N-type well 193, P-type substrate 196, and second N-type doped region 18, two resistors R1 and R2 indicate resistance of P-type substrate 196 and resistance of N-type well 193 separately.

Obviously, after this voltage interface terminal 11 applies on first P-type doped region 17 and first N-type doped region 16 exceeds breakdown voltage of ($V_{BD}$) N-type well 193, numerous electron-hole pairs are formed. Herein, electrons flow through R2 (resistance of N-type well) and N-type doped region 16 into a high voltage point, and holes flow through R1 (resistance of p-type well) and P-type doped region 19 into a low voltage point. And then, a voltage drop is formed while electrons flow through R2 and holes flow through R1, and bipolar junction transistors T1 and T2 would be turned on while this voltage is large enough. Because turn-on of each bipolar junction transistor, such as T1, would drive current through resistance, such as T1, and further increases this voltage drop, another bipolar junction transistor, such as T2, would be further turned-on. A positive feedback loop is formed and a direct result is that SCR is turned-on while a small voltage appears on interface terminal 11. In general, symbol Vtrig indicates the voltage that both bipolar junction transistors are turned on and symbol Itrig indicates corresponding current, and symbol Vh indicates minimum voltage for maintaining SCR being turned-on.

Figure 2A:
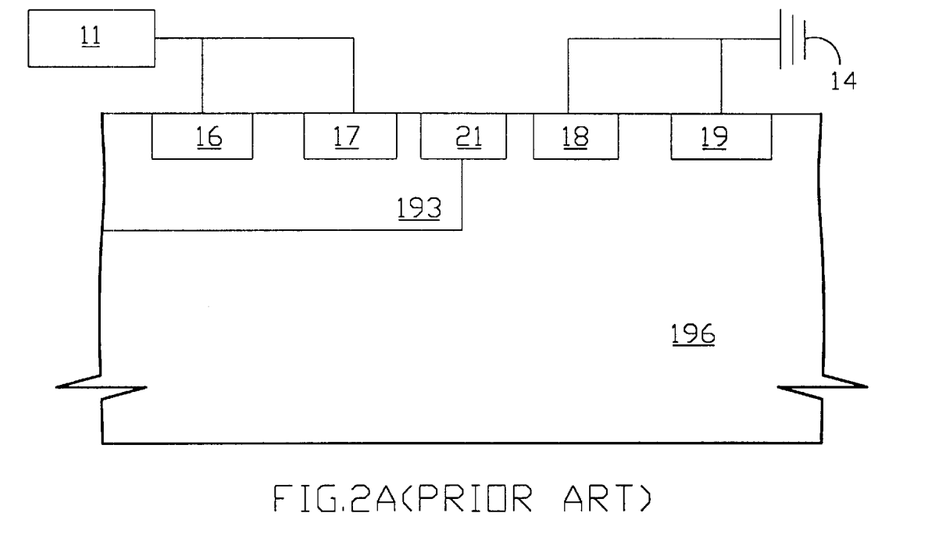
FIG. 2A through FIG. 2C are cross-sectional illustrations about some often-seen ESD protection circuit with SCR.
Figure 2B:
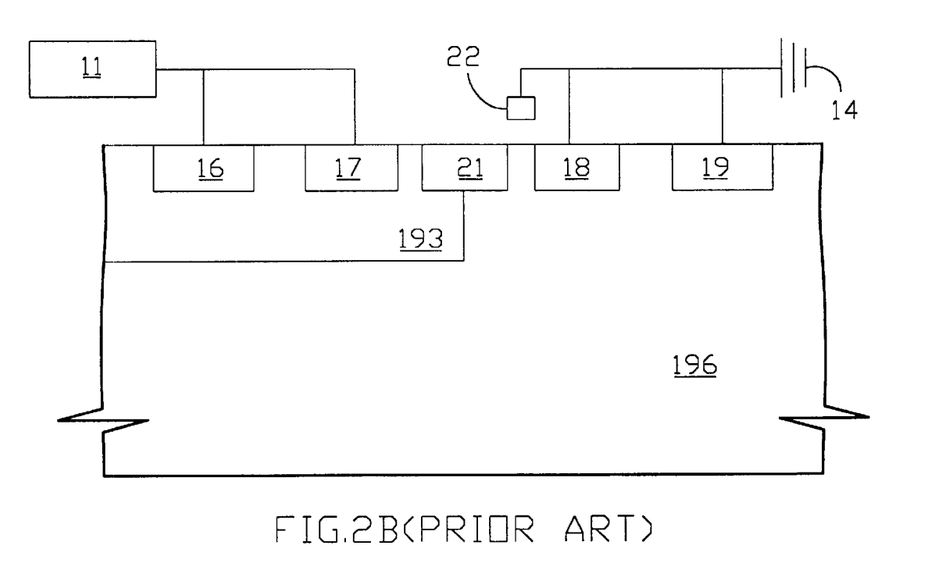
Figure 2C:
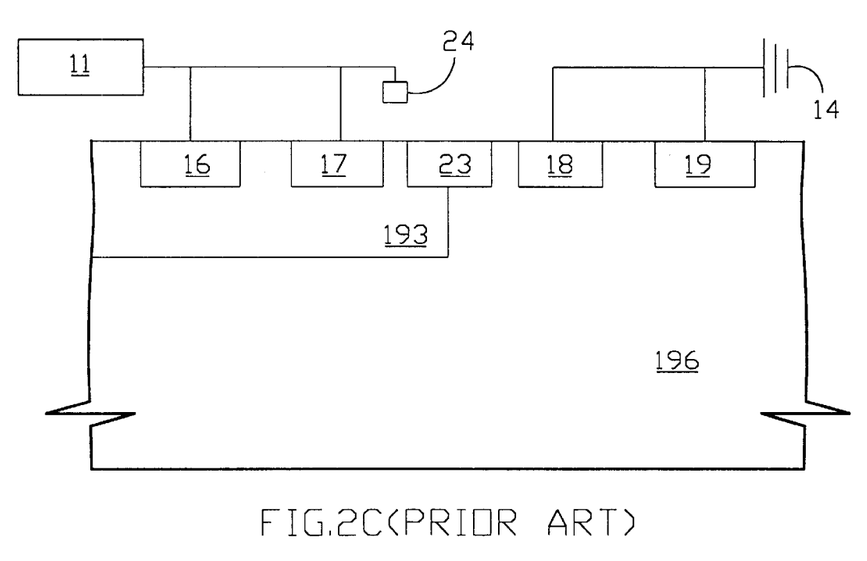

Because triggering voltage decides when ESD protection circuit insulate external signal(s) from devices area 12, it is better to let triggering voltage is briefly equal to work voltage (Vdd) of device area (or the summation of work voltage and a predetermined safety range), to ensure no high voltage external signal flow into devices area 12. In general, triggering voltage of ESD protection circuit could be reduced by following modifications, but all modifications still use two bipolar junction transistors. As FIG. 2A shows, additional N-type doped region 21 is formed between first P-type doped region 17 and second N-type doped region 18 to let SCR could be operated while electrical breakdown between additional N-type doped region and P-type substrate is happened, and leakage current is reduced for lower breakdown voltage. As FIG. 2B shows, both additional N-type region 21 and controlling gate 22, which electrically couple with ground point, are formed at edge of N-type well 193 to form a gated-diode, where voltage required to turn-on this gated-diode is smaller than voltage to turn-on both bipolar junction transistors. As FIG. 2C show, replace additional N-type region 21 by additional P-type region 23, and form controlling gate 24 which electrically coupled with interface terminal 11 but not gate 22 which electrically coupled with ground point 14, such that triggering voltage of SCR is reduced while lower breakdown voltage between additional P-type region 23 and N-type well 193. More discussions about ESD protection circuit with SCR could be acquired by referring this book: ESD IN SILICON INTEGRATED CIRCUITS, ISBN 0-741-95481-0.

However, if interface terminal continuously provide voltage, which is larger than Vh, after both bipolar junction transistors are turned-on, ESD protection circuit would be always turned-on. In the meantime, latch-up phenomena would be happened. Reasonable, whenever integrated circuits is not operated after latch-up phenomena is happened, lowered triggering voltage of ESD protection circuit does not induce any serious damages. In contrast, whenever integrated circuits is operated again after latch-up phenomena is happened, if voltage of normal signal between interface terminal and device area exceeds Vh, this signal would be conducted to ground point after SCR is turned-on by turned-on ESD protection circuit, such that integrated circuits could not properly operate.

Certainly, a direct solution of this problem is to modify configuration of ESD protection circuits with SCR to let Vh is obviously larger than voltage of normal signal, or increases corresponding Itrig and Vtrig. However, because modification of ESD protection circuit also affects $V_{BD}$. Vtrig, and Itrig, quality of ESD protection circuit with SCR also would be affected. Thus, latch-up phenomena still is an urgent problem.

SUMMARY OF THE INVENTION

One main object of this invention is to present an ESD protection circuits with SCR which has the ability to reduce or even eliminate latch-up phenomena.

One preferred embodiment of this invention is an electrostatic discharge protection which is electrically coupled with an interface terminal and a devices area, at least include a first bipolar junction transistor, a second bipolar junction transistor, a first MOS transistor (metal-oxide-semiconductor transistor), and a second MOS transistor. Both bipolar junction transistors forms the well-known silicon controlled rectifier, first MOS transistor locates between interface terminal and base of second bipolar junction transistor (collector of first bipolar junction transistor), and second MOS transistor locates between base of second bipolar junction transistor and ground point, and gates of both MOS transistor electrically coupled with voltage base point whose voltage is equal to work voltage of devices area. While devices area is turned off, silicon controlled rectifier provides function of electrostatic discharge protection and maybe latch-up. While devices area is turned on, second MOS transistor also is turned on so that part of current flows into ground point but not flows into second bipolar junction transistor. Thus, positive feedback between two bipolar junction transistors is reduced and then latch-up is eliminated.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

According to FIG. 1C and corresponding discussion, the applicants of this invention points out latch-up phenomena is induced by the reason that SCR only has the mechanism for building positive feedback but has not the mechanism for eliminating built positive feedback. Thus, after positive feedback loop is built by signal, noise or work signal, appears on interface terminal, positive feedback loop would be maintained by a small signal appears on interface terminal. In the meantime, ESD protection circuits with SCR is operated with latch-up phenomena. However, ESD protection circuits should prevent current flow into devices area while integrated circuits is not operated, and ESD protection circuits should not affect normal communication between devices area and interface terminal while integrated circuits is operated. Therefore, it is desired to eliminate latch-up phenomena while integrated circuits is operated, but latch-up phenomena could enhance ESD protecting ability while integrated circuits is not operated.

Accordingly, following ideas are provided by this invention to solve the problem that ESD protection circuit is latch-up while integrated circuits is operated. Because work voltage of devices area is positive while integrated circuits is operated but work voltage of devices area is near to zero while integrated circuits is not operated, uses a MOS transistor to electrically couple base of one bipolar (npn) junction transistor with a ground point, where this MOS transistor is turned off while work voltage is zero and is turned-on while work voltage is positive. Significantly, even latch-up phenomena is happened while integrated is not operated, because at least partial currents is conducted to this ground point but is not conducted to base of this bipolar (npn) junction transistor while integrated circuits is operated, positive feedback loop would can not be maintained for current continuously flows to ground point, and then latch-up phenomena is eliminated.

Figure 3:
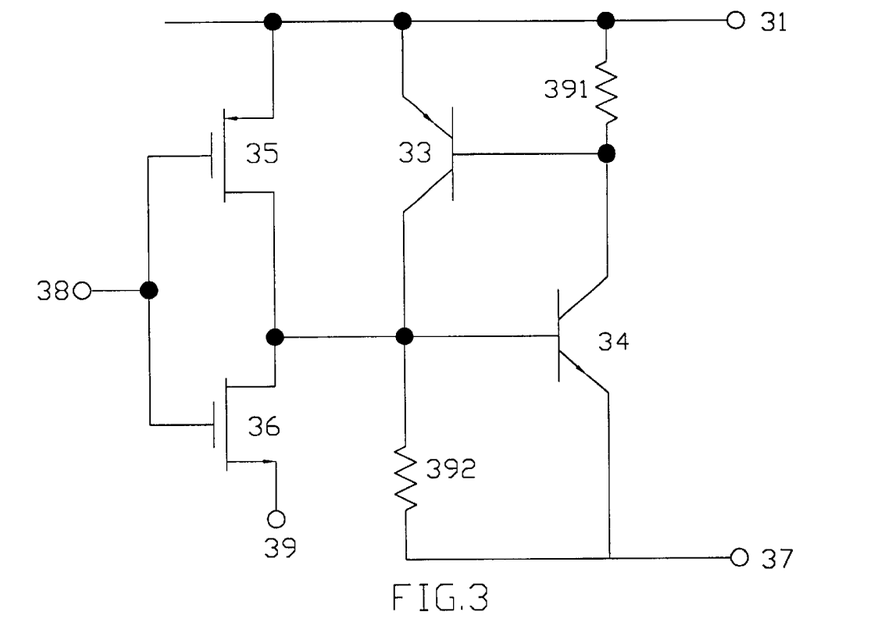
FIG. 3 is an equivalent circuits diagram of one preferred embodiment of this invention.

One preferred embodiment of this present invention is an electrostatic discharge protection circuit which could realize previous ideas. As FIG. 3A shows, this ESD protection circuits electrically couples with both interface terminal 31 and devices area 32, and at least includes first bipolar junction transistor 33, second bipolar junction transistor 34, first MOS transistor 35, second MOS transistor 36, first ground point 37, voltage base point 38, second ground point 39, first resistor 391 and second resistor 392.

Emitter of first bipolar junction transistor 33 electrically couples with interface terminal 31, base of first bipolar junction transistor 33 also electrically couples with interface terminal 31 where first resistor 391 of N-type well connects this base and interface terminal 31, and collector of first bipolar junction transistor 33 electrically couples with first ground point 37 where second resistor 392 connects this collector and first ground point 37.

Collector of second bipolar junction transistor 34 electrically couples with base of first bipolar junction transistor 33, base of second bipolar junction transistor 34 electrically couples with collector of first bipolar junction transistor 33, and emitter of second bipolar junction transistor 34 also electrically coupled with first ground point 37.

Source of first MOS transistor 35 electrically couples with interface terminal 31, drain of first MOS transistor 35 electrically couples with collector of first bipolar junction transistor 33, and gate of first MOS transistor 35 electrically couples with voltage base point 38 whose voltage is equal to the work voltage of devices area 32.

Drain of second MOS transistor 36 is electrically coupled with base of second bipolar junction transistor 34, source of second MOS transistor 36 is electrically coupled with second ground point 39, and gate of second MOS transistor 36 electrically couples with voltage base point 38. And drain of second MOS transistor 36 usually electrically couples with drain of first MOS transistor 35.

Additional, although FIG. 3A shows that first bipolar junction transistor 33 is PNP, second bipolar junction transistor 34 is NPN, first MOS transistor 35 is P-type MOS transistor, and second MOS transistors 36 is N-type MOS transistor. This invention also could following case: first bipolar junction transistor 33 is NPN, second bipolar junction transistor 34 is PNP, first MOS transistor 35 is N-type MOS transistor, and second MOS transistors 36 is P-type MOS transistor.

Further, first MOS transistor 35 could reduce triggering voltage and second MOS transistor 36 are used to let current flow to second ground point 39 so that positive feedback loop could not be maintained. Herein, both previous action are controlled by voltage of voltage base point 38.

Figure 4A:
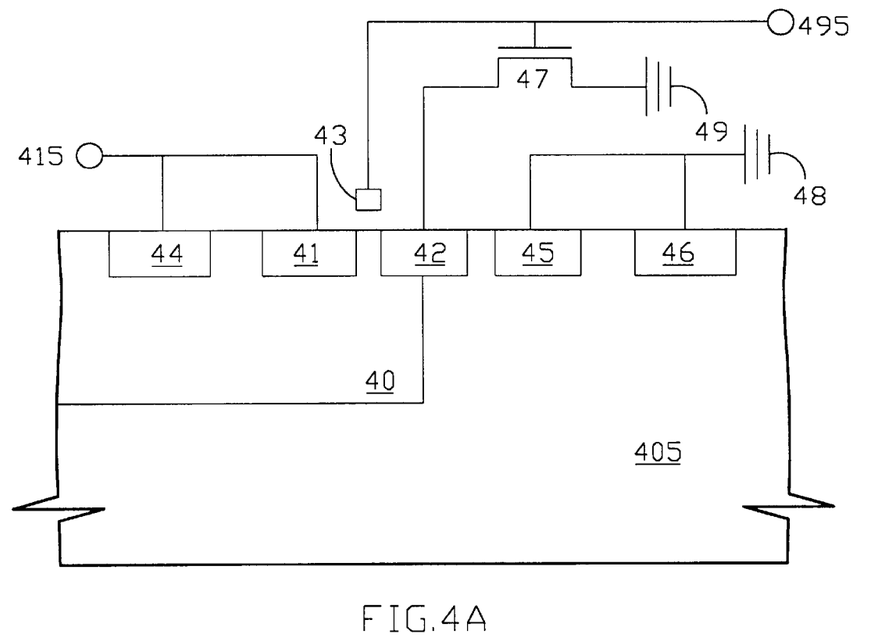
FIG. 4A through FIG. 4C are three cross-sectional illustrations of another preferred embodiment of this present invention

Another preferred embodiment is an electrostatic discharge protection circuit with latch-up prevention function, and is a possible configuration of last embodiment. As FIG. 4A shows, this embodiment is electrically coupled with interface terminal 415 and devices area (not shown), and at least includes well 40, first doped region 41, second doped region 42, gate 43, third doped region 44, fourth doped region 45, fifth doped region 46, MOS transistor 47, first ground point 48, second ground point 49, and voltage base point 495.

Well 40 has a first conductivity and is located in substrate 405 which has a second conductivity. First conductivity is opposite to second conductivity, if first conductivity is P-type then second conductivity is N-type, and if first conductivity is N-type then second conductivity is P-type. Surely, to increase response velocity, first conductivity usually is P-type and second conductivity usually is N-type.

First doped region 41 is located in well 40 and electrically coupled with interface terminal 415, first doped region 41 has second conductivity and dosage of first doped region 415 is larger than dosage of well 40.

Partial second doped region 42 locates in well 40 and partial second doped region 43 directly locates in substrate 405, second doped region 42 is not contacted with first doped region 41, and second doped region 43 has second conductivity with a dosage which is larger than dosage of well 40.

Gate 43 locates over well 40 and between first doped region 41 and second doped region 42.

Third doped region 44 is located in well 40 and electrically coupled with interface terminal 415, third doped region 44 is not contacted with first doped region 41, third doped region 44 and second doped region 42 locate on opposite sides of first doped region 41, and third doped region 44 has first conductivity and haw a dosage which is larger than the dosage of well 40.

Fourth doped region 45, fourth doped region 45 is directly located in substrate 405 and is not contacted with second doped region 42, fourth doped region 45 and first doped region 41 locates on opposite sides of second doped region 42, fourth doped region 45 electrically couples with first ground point 48, and fourth doped region 45 has first conductivity and has a dosage which is larger than the dosage of substrate 405.

Fifth doped region 46 is directly located in substrate 405 and is not contacted with fourth doped region 45, fifth doped region 46 and second doped region 42 locates on opposite sides of fourth doped region 45, fifth doped region 46 is electrically coupled with first ground point 48, and fifth doped region 46 has second conductivity and has a dosage which is larger than the dosage of substrate 405.

Drain of MOS transistor 47 electrically coupled with second doped region 42, source of MOS transistor 47 electrically coupled with second ground point 48, gate of MOS transistor 47 electrically coupled with voltage base point 495 where voltage of voltage base point 495 is equal to the work voltage of devices area, and both source and drain of MOS transistor 47 have first conductivity. Whereby, first ground point 48 and second ground point 49 could be the same ground point, this embodiment is not limited by details of ground points.

Significantly, first doped region 44, well 40, and substrate 405 together form a parasitic bipolar junction transistor; well 40, substrate 405, and fourth doped region 48 together form another parasitic bipolar junction transistor. Because well 40 is base of one parasitic bipolar junction transistor and collector of another parasitic bipolar junction transistor at the same time, and substrate 405 is collector of one parasitic bipolar junction transistor and base of another parasitic bipolar junction transistor at the same time, a positive feedback loop is made of both parasitic bipolar junction transistors, and then current is conducted from interface terminal 405 to first ground point 48. However, because drain of MOS transistor 47 electrically couples with second doped region 42, or electrically with well 40 by second doped region 42, whenever voltage of voltage base point 47 is enough large to let MOS transistor 47 is turned-on, at least partial current of first parasitic bipolar junction transistor flows through MOS transistor 47 to second ground point 49 but not flows to base of second parasitic bipolar junction transistor. Thus, parasitic bipolar junction transistors can not maintain positive feedback loop for current is continuously lost, and then latch-up phenomena is eliminated.

Figure 4B:
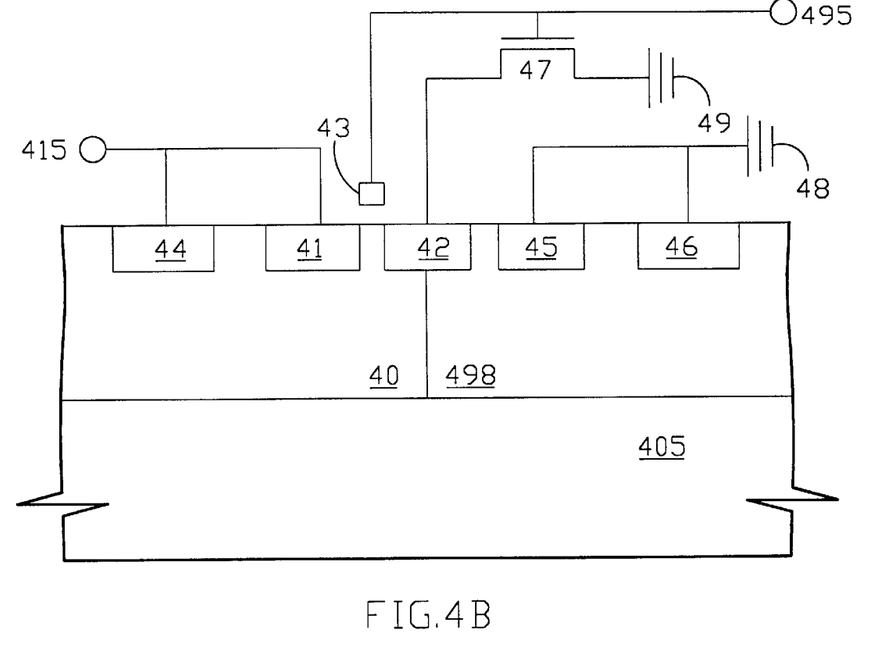
Figure 4C:
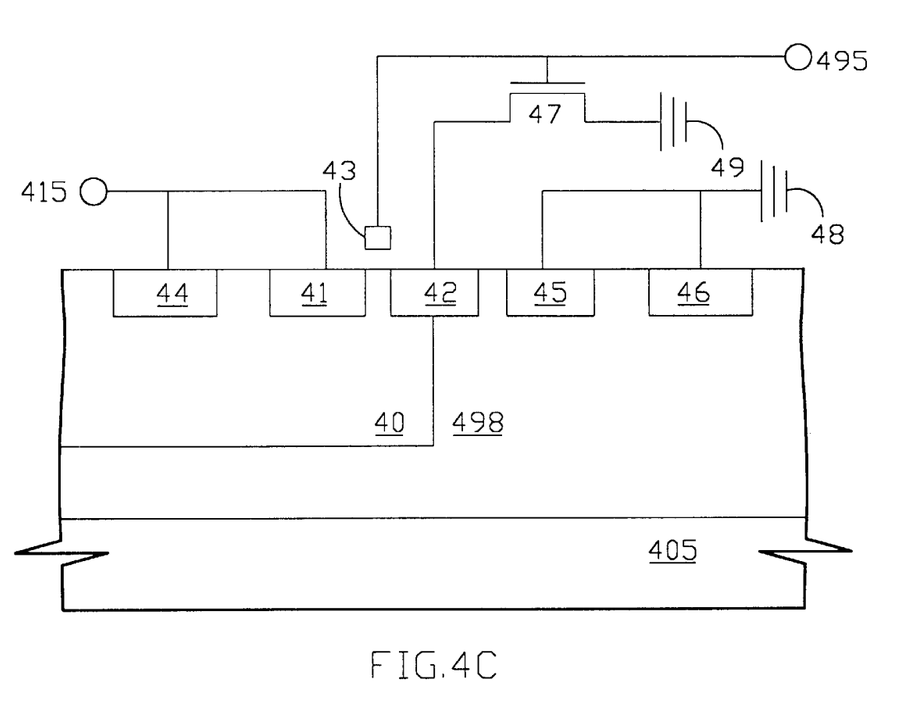

Moreover, because both substrate 405 and well 40 are used to form collector and base of one parasitic bipolar junction transistor and base and collector of another parasitic bipolar junction transistor, and essentially only part of substrate 405, which is closed to well 40, second doped region 42, fourth doped region 45, and fifth doped region 46, takes part in formations of both parasitic bipolar junction transistors. This embodiment also could be modified as FIG. 4B show, additional well 498 is adjacent to well 40 so that fourth doped region 45, fifth doped region 46, and part of second doped region 42 are located in additional well 498 which has second conductivity and has a dosage smaller than dosage of any doped region. Obviously, at this time, first doped region 41, well 40, and additional well together form a parasitic bipolar junction transistor; well 40, additional well 498, and fourth doped region 45 together form another parasitic bipolar junction transistor. Of course, this embodiment also could be modified as FIG. 4C shows, well 40 totally locates in additional well 498. At this time, because substrate 405 essentially does not take part in formation of any parasitic bipolar junction transistor, substrate 405 could have first conductivity or even is an undoped substrate.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. An electrostatic discharge protection circuit with latch-up prevention function, said protection circuit is electrically coupled with an interface terminal and a devices area, comprising:

a well, said well having a first conductivity and being located in a substrate which has a second conductivity;

a first doped region, said first doped region being located in said well and electrically coupled with said interface terminal, and said first doped region having said second conductivity and having a dosage which is larger than the dosage of said well;

a second doped region, part of said second doped region being located in said well and part of said second doped region being directly located in said substrate, said second doped region being not contacted with said first doped region, and said second doped region having said second conductivity and having a dosage which is larger than the dosage of said well;

a gate, said gate being located over said well and between said first doped region and said second doped region;

a third doped region, said third doped region being located in said well and electrically coupled with said interface terminal, said third doped region being not contacted with said first doped region, said third doped region and said second doped region being located on opposite sides of said first doped region, and said third doped region having said first conductivity and having a dosage which is larger than the dosage of said well;

a fourth doped region, said fourth doped region being directly located in said substrate and being not contacted with said second doped region, said fourth doped region and said first doped region being located on opposite sides of said second doped region, said fourth doped region being electrically coupled with a first ground point, and said fourth doped region having said first conductivity and having a dosage which is larger than the dosage of said substrate;

a fifth doped region, said fifth doped region being directly located in said substrate and being not contacted with said fourth doped region, said fifth doped region and said second doped region being located on opposite sides of said fourth doped region, said fifth doped region being electrically coupled with said first ground point, and said fifth doped region having said second conductivity and having a dosage which is larger than the dosage of said substrate;

a voltage base point, voltage of said voltage base point being equal to the work voltage of said devices area; and a MOS transistor, drain of said MOS transistor being electrically coupled with said second doped region, source of said MOS transistor being electrically coupled with a second ground point, gate of said MOS transistor being electrically coupled with said voltage base point, and both source and drain of said MOS transistor having said first conductivity.

2. The protection circuit of claim 1, said first conductivity is opposite to said second conductivity.

3. The protection circuit of claim 1, wherein said first conductivity is P-type and said second conductivity is N-type.

4. The protection circuit of claim 1, wherein said first conductivity is N-type and said second conductivity is P-type.

5. The protection circuit of claim 1, further comprises an additional well which is adjacent to said well, said fourth doped region, said fifth doped region, and part of said second doped region which is not located in said well being located in said additional well, said additional well having said second conductivity and having a dosage which is smaller than the dosage of any said doped regions.

6. The protection circuit of claim 5, said well being located in said additional well.

7. The protection circuit of claim 6, said substrate having said first conductivity.

8. The protection circuit of claim 6, wherein said substrate is neutral undoped substrate.

9. The protection circuit of claim 1, said first doped region, said well, and said substrate together forming a parasitic bipolar junction transistor.

10. The protection circuit of claim 1, said well, said substrate, and said fourth doped region together forming a parasitic bipolar junction transistor.

11. The protection circuit of claim 5, said first doped region, said well, and said additional well together forming a parasitic bipolar junction transistor.

12. The protection circuit of claim 5, said well, said additional well, and said fourth doped region together forming a parasitic bipolar junction transistor.

13. The protection circuit of claim 1, said first ground point and said second ground point being same ground point.

14. An electrostatic discharge protection circuit with latch-up prevention function, said protection circuit is electrically coupled with an interface terminal and a devices area, comprising:

a first bipolar junction transistor, emitter of said first bipolar junction transistor being electrically coupled with said interface terminal, base of said first bipolar junction transistor also being electrically coupled with said interface terminal by through a first resistor, and collector of said first bipolar junction transistor being electrically coupled with a first ground point by through a second resistor;

a second bipolar junction transistor, collector of second bipolar junction transistor being electrically coupled with base of said second bipolar junction transistor, base of said second bipolar junction transistor being electrically coupled with collector of said first bipolar junction transistor, and emitter of said second bipolar junction transistor also being electrically coupled with said first ground point;

a first MOS transistor, source of said first MOS transistor being electrically coupled with said interface terminal, drain of said first MOS transistor being electrically coupled with base of said second bipolar junction transistor, and gate of said first MOS transistor being electrically coupled with a voltage base point whose voltage being equal to the work voltage of said devices area; and a second MOS transistor, drain of said second MOS transistor being electrically coupled with said base of said second bipolar junction transistor, source of said second MOS transistor being electrically coupled with a second ground point, and gate of said second MOS transistor being electrically coupled with said voltage base point.

15. The protection circuit of claim 14, said first MOS transistor being P-type MOS transistor and said second MOS transistor being N-type MOS transistor.

16. The protection circuit of claim 14, said first MOS transistor being N-type MOS transistor and said second MOS transistor being P-type MOS transistor.

17. The protection circuit of claim 14, wherein drain of said second MOS transistor being electrically coupled with drain of said first MOS transistor.

18. The protection circuit of claim 14, further comprises a first resistor which is located between said interface terminal and base of said first bipolar junction transistor.

19. The protection circuit of claim 14, further comprises a second transistor which is located between base of said second bipolar junction transistor and said first ground point.

\* \* \* \* \*